United States Patent
Higaki et al.

[11] Patent Number: 5,501,909
[45] Date of Patent: Mar. 26, 1996

[54] POLYCRYSTALLINE DIAMOND SUBSTRATE AND PROCESS FOR PRODUCING THE SAME

[75] Inventors: Kenjiro Higaki; Hideaki Nakahata; Akihiro Hachigo; Shinichi Shikata, all of Itami, Japan

[73] Assignee: Sumitomo Electric Industries, Ltd., Japan

[21] Appl. No.: 196,609

[22] Filed: Feb. 15, 1994

[30] Foreign Application Priority Data

Feb. 16, 1993 [JP] Japan .................. 5-026506

[51] Int. Cl.$^6$ ............................................ C30B 25/04
[52] U.S. Cl. ............................ 428/408; 428/131; 428/156; 428/698; 428/701; 428/702
[58] Field of Search ................................ 128/408, 698, 128/701, 702, 131, 156

[56] References Cited

U.S. PATENT DOCUMENTS

| | | | |
|---|---|---|---|
| 4,707,384 | 11/1987 | Schachner et al. | 428/408 |
| 4,863,529 | 1/1989 | Imai et al. | 148/33.4 |
| 5,036,373 | 7/1991 | Yamazaki | 251/86 |
| 5,082,359 | 1/1992 | Kirkpatrick | 428/408 |
| 5,114,696 | 5/1992 | Purdes | 423/446 |
| 5,131,963 | 7/1992 | Raur | 148/33.3 |
| 5,144,380 | 9/1992 | Kimoto et al. | 357/22 |
| 5,221,501 | 6/1993 | Feldman et al. | 423/446 |
| 5,260,141 | 11/1993 | Tsai et al. | 428/634 |

FOREIGN PATENT DOCUMENTS

| | | |
|---|---|---|
| 0349414 | 1/1990 | European Pat. Off. . |
| 1-62911 | 3/1989 | Japan . |
| 3-198412 | 8/1991 | Japan . |

OTHER PUBLICATIONS

A. Hiraki et al., Diamond–Like Carbon Thin films, 1987 (No. 128), pp. 41–49.
H. Nakahata et al., Study on High Frequency SAW Filter of (ZnO/Diamond/Si) Structure, p. 275.
IBM Technical Disclosure Bulletin, vol. 34, No. 3, Aug. 1991, New York US p. 54; Cuomo et al. 'Improved surface smoothness of polycrystalline diamond'.
Patent Abstracts of Japan, vol. 11, No. 40 (P–544) 5 Feb. 1987 & JP–A–61 210 518 (Matsushita Electric Ind. Co.) 18 Sep. 1986.
Patent Abstracts of Japan vol. 16, No. 207 (C–0941) 18 May 1992 & JP–A–04 037 616 (Canon Inc.) 7 Feb. 1992.

Primary Examiner—A. A. Turner
Attorney, Agent, or Firm—Pennie & Edmonds

[57] ABSTRACT

A diamond substrate having a smooth surface, including a polycrystalline diamond film having a surface with a pit, and an insulating material other than diamond, which occupies the pit.

11 Claims, 3 Drawing Sheets

Raman spectra of various phases of carbon.

(a) amorphous carbon.
(b) graphite.
(c) diamond.

POLYCRYSTALLINE DIAMOND SUBSTRATE AND PROCESS FOR PRODUCING THE SAME

BACKGROUND OF THE INVENTION

1. Field of the Invention

The present invention relates to a polycrystalline diamond substrate, more particularly to a polycrystalline diamond substrate having a smooth surface and a process for producing such a polycrystalline diamond substrate.

2. Related Background Art

Diamond has the highest hardness among all of the solid materials which are present on the earth, is electrically an insulator and has the highest thermal conductivity within a temperature range of 30° to 650° C. In addition, diamond optically has an excellent light transmission characteristic in a wide wavelength range except for a certain part of an infrared region. Therefore, diamond having such outstanding characteristics is expected to be utilized in various technical or scientific fields.

Further, diamond has the highest sound velocity among all of the substances, and is stable thermally and chemically. Therefore, by utilizing such characteristics of diamond, for example, an application of diamond to devices such as surface acoustic wave (SAW) devices has been investigated. A surface acoustic wave device utilizing diamond can be used in an extremely high frequency region, e.g., by using a diamond film as a substrate, as disclosed in Japanese Laid-Open Patent Application Nos. Sho 64-62911 (No. 62911/1989) and Hei 3- 198412 (No. 198412/1991).

The surface acoustic wave device using a diamond film as a substrate may be fabricated in the following manner.

First, a diamond film is formed on a substrate of Si, etc., by vapor-phase synthesis. Next, the surface of the vapor-phase synthesized diamond film is polished to be smooth. Further, the vapor-phase synthesized diamond film having the smooth surface is used as a substrate, and an electrode is formed thereon by microfabrication.

As described above, when a surface acoustic wave device using a diamond film as a substrate is intended to be fabricated, the surface of the diamond film formed by vapor-phase synthesis is polished before an electrode is formed on the diamond film.

However, since the diamond has a high hardness, polishing of the surface thereof is not sufficient in some cases, and therefore some scratches caused by the polishing can be left on the surface. Further, since the vapor-phase synthesized diamond film is polycrystalline, dropout of some particles may occur due to the polishing treatment, or an unfilled or unoccupied portion remaining in the inside of the diamond film may appear on the surface thereof as a hole due to the polishing. Therefore, in general, some pits or concavities having a dimension of up to few microns still remain on the surface of the vapor-phase synthesized diamond film even after the polishing thereof. Accordingly, in the prior art, there has been posed a problem that when a fine electrode or line having a dimension of submicron to several microns is formed on the vapor-phase synthesized diamond substrate having such a surface which is not sufficiently smooth, the fine electrode or line is liable to be cut or broken.

SUMMARY OF THE INVENTION

An object of the present invention is, in view of the above-mentioned problems encountered in the prior art, to provide a polycrystalline diamond substrate having a smooth surface.

Another object of the present invention is to provide a process for producing a polycrystalline diamond substrate having a smooth surface.

According to the present invention, there is provided a diamond substrate having a smooth surface, comprising: a polycrystalline diamond film having a surface with a pit, and an insulating material other than diamond, which occupies the pit.

The present invention also provides a process for producing a diamond substrate, comprising:

forming an insulating film comprising a material other than diamond on a polycrystalline diamond film disposed on a substrate; and polishing the insulating film to expose a surface of the polycrystalline diamond film, thereby to provide a smooth surface.

The above-mentioned polycrystalline diamond substrate according to the present invention has a smooth surface of which a pit (or concavity) is occupied or filled with an insulating material other than diamond. Accordingly, even when an electrode and/or line is formed by microfabrication on the above-mentioned polycrystalline diamond substrate of which the surface is sufficiently smooth, substantially no breakage of the electrode or line occurs.

In addition, in the process for producing a diamond substrate according to the present invention, an insulating film comprising a material other than diamond is formed on a polycrystalline diamond film of which the surface has a pit, and then the insulating film is polished so that the surface of the diamond film is exposed. Accordingly, the pit of the polycrystalline diamond film surface is occupied or filled with the insulating material other than diamond, whereby the surface of the diamond film becomes smooth.

Further objects and advantages of the present invention will be apparent from the description of the preferred embodiments with the accompanying drawings.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 3 shows a state wherein a polycrystalline diamond film is formed on a predetermined substrate.

FIG. 4 shows a state wherein an insulating film comprising a material other than diamond is formed on the polycrystalline diamond film.

FIG. 5 shows a state of the polycrystalline diamond film after the insulating film is polished so that the surface of the polycrystalline diamond film is exposed.

DETAILED DESCRIPTION OF THE PREFERRED EMBODIMENTS

Hereinbelow, preferred embodiments of the present invention will be described with reference to the accompanying drawings as desired.
(Polycrystalline diamond substrate)

Figure 1:
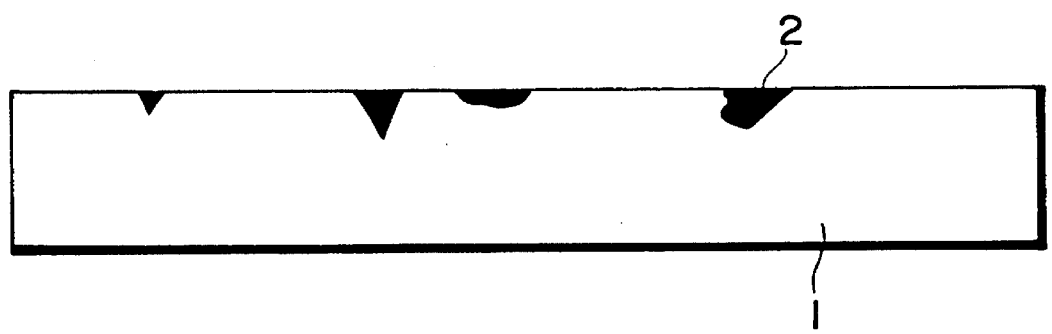
FIG. 1 is a schematic sectional view showing a polycrystalline diamond substrate according to an embodiment of the present invention.

FIG. 1 is a schematic side sectional view showing a polycrystalline diamond substrate according to an embodiment of the present invention.

Referring to FIG. 1, the polycrystalline diamond substrate comprises a polycrystalline diamond film 1 and an insulating material 2 located in a pit (or pits) of the surface of the diamond substrate 1. The placement of the insulating material 2 in the pit of the surface of the diamond substrate 1 may for example be confirmed by distinguishing the diamond film 1 from the insulating material 2 by a secondary-electron reflection image formed by a scanning electron microscope (SEM), or by a surface analysis conducted by micro Auger electron spectroscopy.

The polycrystalline diamond substrate according to the present invention has a smooth surface. The surface smoothness (or surface roughness) of the diamond substrate according to the present invention may preferably be 500 Å or below, more preferably 100 Å or below, in terms of $R_{max}$ (JIS (Japanese Industrial Standard) B 0601–1970; Osamu Taniguchi, "KIKAI KEISOKU (Mechanical Metrology)", pp. 77–80, Youkendo, 1974"), based on a tracer method.

The surface smoothness of the diamond substrate according to the present invention may also be evaluated in the following manner.

That is, an Al film having a thickness of 0.1 μm is formed on the above-mentioned diamond substrate to be evaluated by a sputtering method, and then the Al film is patterned by photolithography and reactive ion etching (RIE), thereby to form 100 Al lines each having a width of 1 μm and a length of 500 μm. When the conductivities of the 100 Al lines thus formed are examined by means of a prober, in the diamond substrate according to the present invention, the number of broken or cut lines in the above-mentioned 100 Al lines may preferably be 10 or below, more preferably 5 or below (particularly preferably 2 or below).
(Polycrystalline diamond)

In the present invention, a method of forming a polycrystalline diamond film 1 is not particularly restricted. In view of easiness of the formation of a film having a desired thickness, the polycrystalline diamond film 1 may preferably be formed by vapor-phase synthesis or vapor deposition. In view of easiness of the formation of a film having a desired characteristic, the polycrystalline diamond film 1 may preferably be formed by a CVD (chemical vapor deposition) process.
(Insulating material)

As the above-mentioned insulating material 2 for filling the pit of the surface of the polycrystalline diamond film 1, an insulating material other than diamond is used. The resistivity of the insulating material 2 (measured by a four-probe method) may preferably be $10^6$ Ω.cm or higher, more preferably $10^8$ Ω.cm or higher.

In view of the heat resistance of the insulating material 2, the insulating material 2 may preferably be an inorganic material. In addition, the insulating material 2 may preferably have a softening point of 300° C. or higher (more preferably 500° C. or higher). In view of easiness of the deposition of the insulating material 2 on (or into) the pit of the surface of the polycrystalline diamond film 1, the insulating material 2 may preferably be a material which can be deposited by vapor deposition technique. More specifically, preferred examples of the insulating material 2 may include: oxides such as $SiO_2$, YSZ ($Y_2O_3$ (yttria)-stabilized $ZrO_2$ (zirconia)), $Al_2)_3$, and ZnO; carbides such as SiC and TiC; nitrides such as $Si_3N_4$ and AlN; and DLC (diamond-like carbon).
(Diamond-like carbon)

In the above-mentioned specific insulating materials, DLC has features such that it is an amorphous material having a high hardness and has an excellent stability, and practically, it is not necessary to consider element diffusion or/and reaction thereof to diamond, since the DLC comprises carbon atoms which are the same as those constituting diamond. Therefore, the DLC may particularly preferably be used as an insulating material 2 for filling the pit of the diamond substrate 1.

The above-mentioned DLC (also called "i-carbon" or "amorphous carbon") is a material having the following properties.

(1) In general, the DLC comprises hydrogen atoms in addition to carbon atoms. In this case, the mole of hydrogen atoms contained in the DLC may preferably be smaller than the mole of carbon atoms contained in the DLC.

Figure 2:
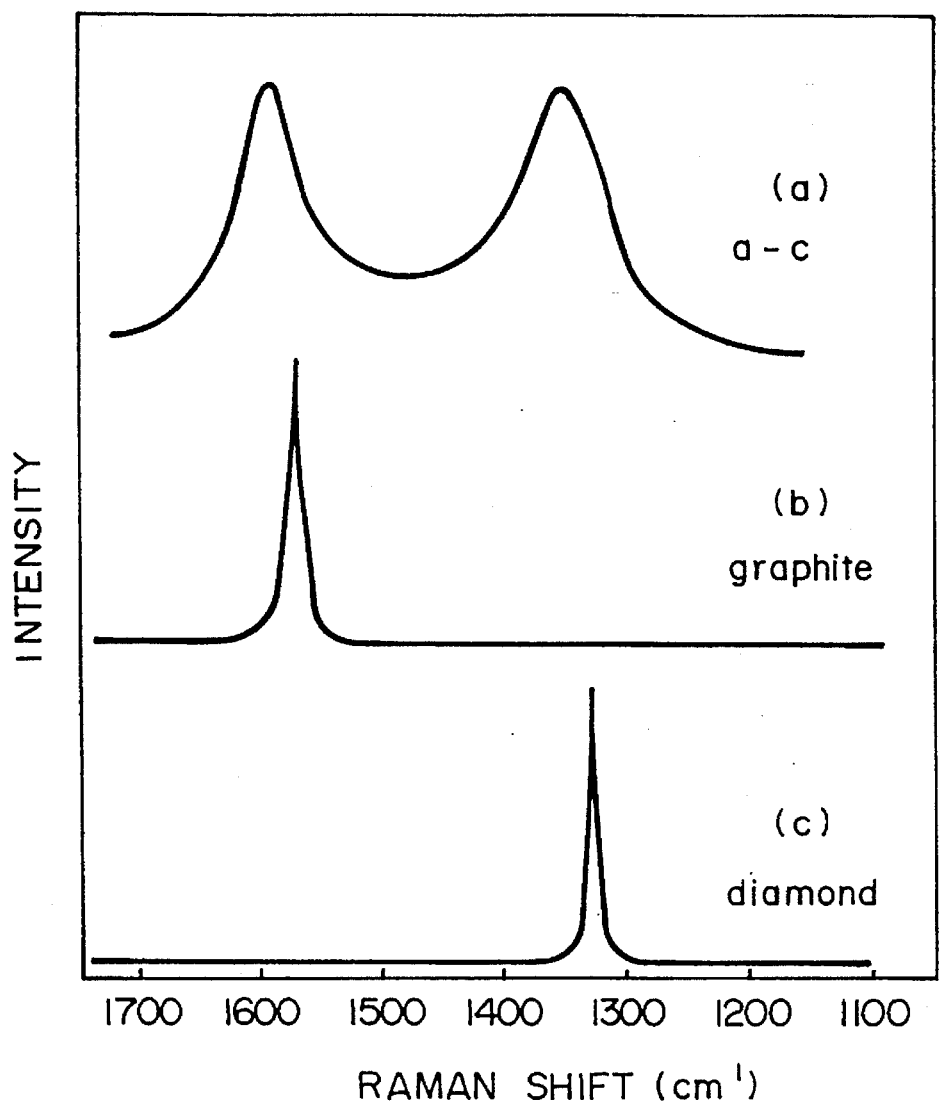
FIG. 2 is a schematic chart showing typical Raman spectra of amorphous carbon (a), graphite (b), and diamond (c), respectively.

(2) The DLC has an amorphous crystalline state. The DLC, diamond, and graphite may mutually be distinguished from each other by means of a Raman spectroscopic method. Typical Raman spectra of DLC (or amorphous carbon) (a), graphite (b), and diamond (c) are shown in FIG. 2. As shown in FIG. 2, a sharp peak appears at 1332 $cm^{-1}$ (based on $sp^3$ C—C bond) in the spectrum of diamond (c), and a sharp peak appears at 1580 $cm^{-1}$ (based on $sp^2$ C—C bond) in the spectrum of graphite (b), whereas broad peaks appear at 1360 $cm^{-1}$ and 1600 $cm^{-1}$ in the spectrum of DLC (c).

(3) The DLC has a higher hardness than that of an ordinary metal. More specifically, the DLC to be used in the present invention may preferably have a Vickers hardness Hv of about 1,000 to 5,000, while diamond usually has a Vickers hardness Hv of about 10,000.

The DLC having the above-mentioned characteristics may be obtained under the same CVD condition as that for diamond formation described hereinafter, while decreasing the temperature of a substrate on which the DLC is to be deposited (for example, the substrate temperature may preferably be about 100° C.). With respect to more detail of DLC, for example, Akio Hiraki and Hiroshi Kawarada, "TANSO (Carbon)" published by The Carbon Society of Japan, Tokyo, 1987 (No. 128), p. 41" may be referred to.

Figure 3:
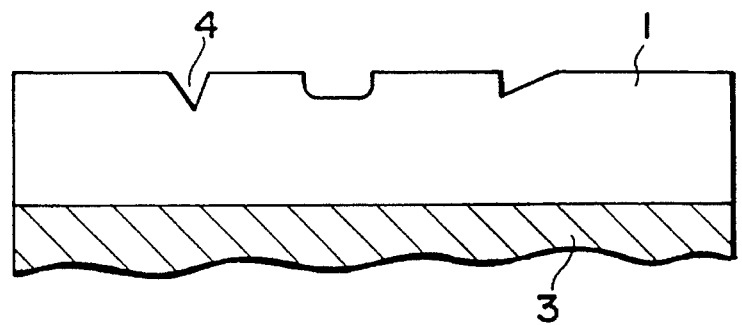
FIGS. 3 to 5 are schematic sectional views for illustrating a process for producing a polycrystalline diamond substrate according to an embodiment of the present invention.
Figure 4:
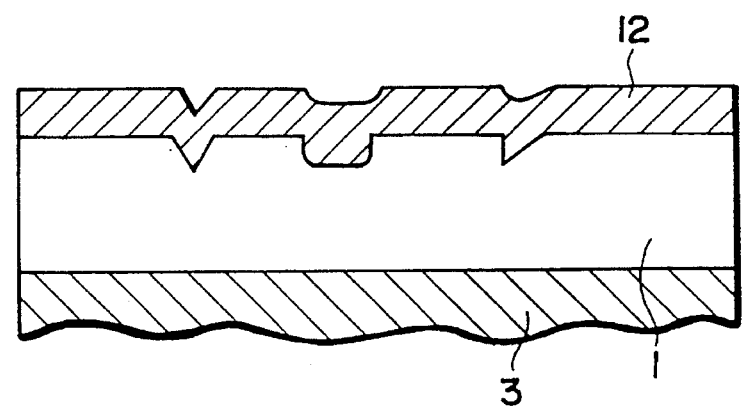
Figure 5:
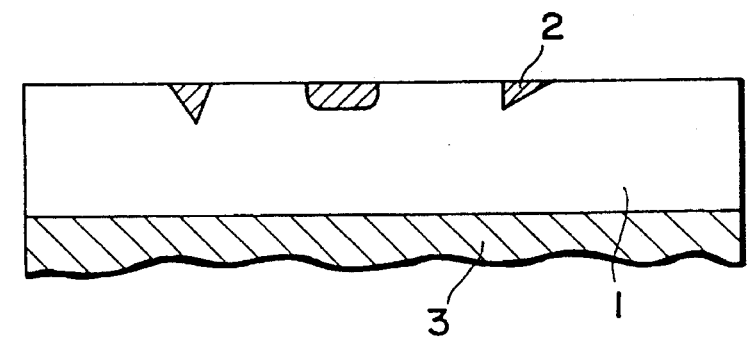

FIGS. 3 to 5 are schematic side sectional views for illustrating a process for producing a polycrystalline diamond substrate according to an embodiment of the present invention.

Referring to FIG. 3, first, a polycrystalline diamond film 1 is formed on a predetermined substrate (e.g., an Si substrate) 3. The diamond film 1 may preferably have a thickness of 10 μm or larger (more preferably 25 μm or larger).

Next, as desired, the thus formed diamond film 1 is polished, e.g., by using a diamond abrasive. The diamond film 1 after the polishing may preferably have a thickness of 5 μm or larger (more preferably 20 μm or larger). When the thickness of the diamond film 1 before the polishing is denoted by $t_1$ and the thickness of the diamond film 1 after the polishing is denoted by $t_2$, in general, the value of $(t_1-t_2)$ may preferably be 2 μm or larger (more preferably, 5 μm or larger).

As described hereinabove, after such-polishing, the diamond film 1 usually has a pit 4 on the surface thereof (FIG. 3).

Next, referring to FIG. 4, an insulating film 12 comprising an insulating material 2 other than diamond is formed on the diamond film 1, e.g., by vapor-phase synthesis. The insulating film 12 thus formed may preferably have a thickness of about 0.1 to 100 μm (more preferably about 1 to 10 μm)

Further, referring to FIG. 5, the surface of the diamond film 1 is exposed by polishing the insulating film 12 which has been formed on the diamond film 1. In general, such polishing may be performed by using various abrasives (or abrasive grains). The abrasive to be usable for such a purpose is not particularly limited as long as the abrasive has a hardness higher than or equal to that of the insulating film 12, and comprises a material having a lower hardness than that of diamond (that is, a material other than diamond). More specifically, for example, it is possible to use an abrasive (for example, conventional sand paper) comprising SiC, $Al_2O_3$, etc. The exposure of the surface of the diamond film 1 due to the polishing may for example be confirmed by use of an optical microscope or surface-enhanced Raman spectroscopy.

At the time of the polishing as described above, in a case where an abrasive comprising a material other than diamond is used, the diamond film 1 itself is not polished since the diamond film 1 has a higher hardness than that of the abrasive to be used for the grinding. As a result, the pit 4 of the surface of the diamond film 1 is filled or occupied with the insulating material 2 other than diamond, whereby a diamond substrate (as shown in FIG. 5) having a smooth surface may be obtained.

The present invention will be described in more detail with reference to specific Examples.

EXAMPLES

Polycrystalline diamond substrates of which the surfaces were smooth were produced by vapor-phase synthesis in the following manner.

(1) Referring to FIG. 3, a 1.0 mm-thick Si substrate 3 (10 mm×10 mm square) the surface of which had been polished to be smooth by electrolytic polishing was placed in a plasma CVD apparatus. A reaction chamber of the CVD apparatus was evacuated, and a mixture gas of $H_2$ and $CH_4$ ($H_2$: $CH_4$=200: 1 in terms of a volume ratio; hereinafter, gas ratios are expressed by volume ratios) was introduced into the reaction chamber. Plasma CVD was conducted to form a 50 μm-thick polycrystalline diamond film 1 on the Si substrate 3 under the conditions that the pressure of the reaction chamber was about 40 Torr, the temperature of the substrate 3 was 850° C., and the power of microwave was 400 W.

(2) Next, the thus formed diamond film 1 was subjected to mechanical polishing by using an electro-deposited diamond polishing stone, and the diamond film 1 was polished so as to provide a film thickness of 30 μm.

(3) On the thus polished diamond film 1, a film 12 of an insulating material (A) as shown in the following Table 1 was formed so as to provide a film thickness of 10 μm by a film formation process (B) as shown in the following Table 1.

TABLE 1

| SAMPLE No. | Insulating material (A) | Film formation process (B) | Abrasive grain (C) | Number of broken lines |
|---|---|---|---|---|
| EXAMPLES | | | | |
| 1 | $SiO_2$ | Sputtering | SiC | 0 |
| 2 | ZnO | Sputtering | SiC | 0 |
| 3 | $Al_2O_3$ | Sputtering | $Al_2O_3$ | 1 |
| 4 | SiC | CVD | SiC | 0 |
| 5 | AlN | CVD | SiC | 1 |
| 6 | DLC | CVD | $Al_2O_3$ | 0 |
| COMPARATIVE EXAMPLES | | | | |
| 1 | — | — | — | 15 |
| 2 | — | — | — | 21 |
| 3 | — | — | — | 18 |
| 4 | — | — | — | 11 |
| 5 | — | — | — | 25 |
| 6 | — | — | — | 17 |

The film formation process (B) shown in the above Table 1 was conducted under the following conditions, <Sputtering> (with respect to $SiO_2$, ZnO and $Al_2O_3$)

RF power: 200 W

Substrate temperature: 200° C.

Sputtering gas: Ar containing 20% of $O_2$

Gas pressure: 100 mTorr

<Thermal CVD> (with respect to SiC)

Substrate temperature: 1000° C.

Gas: 50% of propane+50% of silane

Gas pressure: 760 Torr

<MOCVD> (with respect to AlN)

Substrate temperature: 900° C.

Gas: 60% of trimethyl aluminum+40% of ammonia

Gas pressure: 760 Torr

<Plasma CVD> (with respect to DLC)

RF power: 200 W

Substrate temperature: 100° C.

Gas: Methane

Gas pressure: 5 mTorr (4) Next, the above-mentioned insulating film 12 of the insulating material (A) was polished by using an abrasive grain (C) as shown in the above Table 1, until the surface of the diamond film 1 was exposed. The exposure of the surface of the diamond film 1 was confirmed by using an optical microscope. In this case, as the SiC abrasive grain, commercially available sand paper was used. Further, as the $Al_2O_3$ abrasive grain, commercially available $Al_2O_3$ fine powder was used, and buff polishing was conducted.

At the time of the above polishing, the diamond film was not polished since the diamond film 1 itself had a higher hardness than that of the abrasive grain (C) used for the polishing. Based on the above treatment, the pit of the surface of the diamond film 1 was filled with the insulating material (A) other than diamond, and six kinds of diamond substrates (Examples 1 to 6) having a smooth surface were obtained (FIG. 5).

On the vapor-phase synthesized diamond substrate obtained above, Al lines were formed in the following manner.

(5) First, an Al film having a film thickness of 0.1 μm was formed by sputtering on the above-mentioned diamond substrate under the following conditions.

DC power: 3 KW

Substrate temperature: room temperature

Sputtering gas: Ar

Gas pressure: 8 mTorr (6) Next, the thus formed Al film was patterned by photolithography and reactive ion etching (RIE), thereby to form 100 Al lines each having a width of 1 μm, and a length of 500 μm in the samples obtained in the above Examples 1 to 6.

<RIE conditions>

Gas: $CCl_4$ (50%)+$Cl_2$ (50%)

Gas pressure: 40 mTorr

RF power: 200 W

Substrate temperature: 30° C.

(7) Conductivities of the 100 Al lines thus formed were examined by use of a prober, and the number of broken lines in the above-mentioned 100 Al lines was measured. The results are also shown in the above Table 1.

On the other hand, six species of vapor-phase synthesized diamond substrates were prepared in the same manner as in the above Examples 1 to 6, except that the above-mentioned steps of (3) and (4) were not conducted. Then, 100 Al lines were formed on the thus prepared substrates, and the number of broken lines was measured in the same manner as described above. The results are shown in the above Table 1.

As shown in the above Table 1, since the diamond substrate according to the present invention had a high surface smoothness, even when fine lines or electrodes were formed on the diamond substrate, breakage of the line was effectively suppressed.

As described hereinabove, according to the present invention, a polycrystalline diamond substrate having a smooth surface may be obtained. Even when an electrode or line is formed by microfabrication on the polycrystalline diamond substrate according to the present invention, breakage of the electrode or line is prevented.

Accordingly, the polycrystalline diamond substrate according to the present invention may effectively be used for, e.g., a substrate for a device such as a surface acoustic wave device.

In addition, the polycrystalline diamond substrate according to the present invention may preferably be used as a substrate for mounting a semiconductor device such as multi chip module (MCM). Moreover, the diamond substrate according to the present invention may also be utilized for various semiconductor devices (such as transistors and diodes) in which diamond is used for a substrate.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A diamond substrate having a polished smooth surface, comprising:

a polycrystalline diamond film having a surface with a pit, and an insulating material other than diamond having a resistivity of $10^6$ Ω.cm or higher, which occupies the pit, at least a portion of the surface of the polycrystalline diamond film being exposed from the insulating material.

2. A diamond substrate according to claim 1, wherein the polished smooth surface has a surface smoothness of 500 Å or below in term of $R_{max}$.

3. A diamond substrate according to claim 1, wherein the polycrystalline diamond film is a film formed by vapor-phase synthesis.

4. A diamond substrate according to claim 3, wherein the polycrystalline diamond film is a film formed by chemical vapor deposition.

5. A diamond substrate according to claim 1, wherein the insulating material comprises an inorganic material.

6. A diamond substrate according to claim 1, wherein the insulating material is a material which is capable of forming a film by vapor deposition.

7. A diamond substrate according to claim 1, wherein the insulating material is a material selected from the group consisting of oxides, carbides and nitrides.

8. A diamond substrate according to claim 8, wherein the insulating material is a material selected from the group consisting of $SiO_2$, $Y_2O_3$-stabilized ZrO, $Al_2O_3$, ZnO, SiC, TiC, $Si_3N_4$ and AlN.

9. A diamond substrate according to claim 1, wherein the insulating material comprises amorphous carbon.

10. A diamond substrate according to claim 9, wherein the amorphous carbon has a Vickers hardness of about 1,000 to 5,000.

11. A diamond substrate according to claim 1, wherein the polished smooth surface comprise a mechanically polished surface.

* * * * *